(12) United States Patent
Luo et al.

(10) Patent No.: US 10,707,644 B1
(45) Date of Patent: Jul. 7, 2020

(54) LASER DIODE DEVICE

(71) Applicant: SHANGHAI ORIENT-CHIP TECHNOLOGY CO., LTD., Shanghai (CN)

(72) Inventors: Jie Luo, Shanghai (CN); Lien-Chuan Huang, New Taipei (TW); Chi-Ming Wu, New Taipei (TW)

(73) Assignee: SHANGHAI ORIENT-CHIP TECHNOLOGY CO., LTD., Shanghai (CN)

( * ) Notice: Subject to any disclaimer, the term of this patent is extended or adjusted under 35 U.S.C. 154(b) by 0 days.

(21) Appl. No.: 16/431,785

(22) Filed: Jun. 5, 2019

(51) Int. Cl.
| | |
|---|---|
| H01S 5/02 | (2006.01) |
| H01S 5/022 | (2006.01) |
| H01S 5/042 | (2006.01) |
| H01S 5/026 | (2006.01) |

(52) U.S. Cl.
CPC ........ *H01S 5/02252* (2013.01); *H01S 5/0206* (2013.01); *H01S 5/0261* (2013.01); *H01S 5/02288* (2013.01); *H01S 5/0425* (2013.01)

(58) Field of Classification Search
CPC .. H01S 5/02252; H01S 5/0261; H01S 5/0206; H01S 5/02288; H01S 5/0425
See application file for complete search history.

(56) References Cited

U.S. PATENT DOCUMENTS

| | | | | |
|---|---|---|---|---|
| 8,378,475 | B1* | 2/2013 | Veitch | H01L 31/02327 257/686 |
| 2006/0262822 | A1* | 11/2006 | Tatum | H01S 5/0261 372/38.1 |
| 2009/0296762 | A1* | 12/2009 | Yamaguchi | H01S 5/02208 372/34 |
| 2012/0045216 | A1* | 2/2012 | Guo | H01S 5/4025 398/135 |
| 2013/0039374 | A1* | 2/2013 | Lutgen | H04N 9/3161 372/43.01 |
| 2016/0164252 | A1* | 6/2016 | Parsa | H01L 31/109 257/432 |
| 2016/0182886 | A1* | 6/2016 | Lin | H01L 27/14618 348/46 |
| 2016/0285232 | A1* | 9/2016 | Reinert | H01S 5/02296 |
| 2017/0005453 | A1* | 1/2017 | Yim | H01L 31/0232 |
| 2019/0025214 | A1* | 1/2019 | Rothberg | G01N 21/6402 |
| 2019/0196200 | A1* | 6/2019 | Pierer | H01S 5/423 |

\* cited by examiner

*Primary Examiner* — Yuanda Zhang
(74) *Attorney, Agent, or Firm* — Schmeiser, Olsen & Watts, LLP

(57) ABSTRACT

A laser diode device includes a laser diode component, a lens, a first carrying element, a driving chip and a second carrying element. The first carrying element receives the laser diode component and the lens. The second carrying element receives the driving chip and is disposed below the first carrying element to carry the first carrying element and electrically connected to the first carrying element.

8 Claims, 2 Drawing Sheets

LASER DIODE DEVICE

BACKGROUND OF THE INVENTION

1. Field of the Invention

The present disclosure relates to laser diode devices, and in particular to a laser diode device capable of reducing a signal transmission distance.

2. Description of the Related Art

Thanks to their advantages, better linearity, micro-spots and high laser density, laser diodes are widely used in reading, communication, measurement, sensing, etc. In recent years, laser diodes are widely applicable to facial recognition and object recognition provided by mobile devices (such as smartphones and tablets), for example, to perform facial recognition in conjunction with time of flight (ToF) technology. A conventional laser diode often operates in conjunction with a driving signal generated by a driving chip and thereby emits laser according to the driving signal received. Hence, the control over the driving speed of the laser diode depends on the driving signal received. Recognition efficiency depends directly on the driving speed of the laser diode. The higher the driving speed is, the higher are the recognition speed and the recognition precision.

BRIEF SUMMARY OF THE INVENTION

The longer the route taken to transmit a driving signal is, the more the driving signal loses its strength because of the electrical properties, such as impedance, of the route. The reduction in the strength of the driving signal leads to a reduction in the laser diode driving speed, to the detriment of recognition speed and efficiency. To increase the laser diode driving speed by reducing the signal transmission distance between the laser diode and a driving chip, the present invention provides a laser diode device which comprises a laser diode component, a lens, a first carrying element, a driving chip, a second carrying element, a laser diode module and a driving chip module. The first carrying element receives the laser diode component and the lens. The second carrying element receives the driving chip and is disposed below the first carrying element to carry the first carrying element and is electrically connected to the first carrying element.

The overlapped first carrying element and second carrying element greatly reduce the routing distance between the laser diode component and the driving chip, and thus reduce signal loss which might otherwise occur because an overly long routing distance. Furthermore, the aforesaid overlap greatly reduces the surface area occupied by the laser diode component and the driving chip on the wirings and renders routing convenient. Furthermore, with two carrying elements being adapted to achieve thermal and electrical separation of the laser diode component and the driving chip, the performance of the driving chip remains unabated despite the heat generated by the laser diode component in operation.

Optionally, the first carrying element comprises a first ceramic carrier, a first metal layer, a first sidewall, a first support portion and a first electrode portion. The first metal layer is disposed on the first ceramic carrier. The first sidewall is disposed on the first metal layer. The first support portion protrudes from the inner side of the first sidewall. The first support portion, the first sidewall and the first metal layer define a first receiving space and a second receiving space together. The first electrode portion is disposed below the first ceramic carrier.

Optionally, the first receiving space receives the laser diode component, and the second receiving space receives the lens.

Optionally, the first ceramic carrier comprises the first through holes for receiving conducting wires connected between the metal layer and the first electrode portion.

Optionally, the first electrode portion comprises a first electrode and a second electrode which are each electrically connected to the laser diode component.

Optionally, the second carrying element comprises a second ceramic carrier, a second metal layer, a second sidewall, a second support portion and a second electrode portion. The second metal layer is disposed on the second ceramic carrier. The second sidewall is disposed on the second metal layer. The second support portion protrudes from the inner side of the second sidewall. The second support portion, the second metal layer and the second sidewall define a third receiving space and a fourth receiving space together. The second electrode portion is disposed below the second ceramic carrier.

Optionally, the third receiving space receives the driving chip, the fourth receiving space receives the first electrode portion, and the first electrode portion is electrically connected to the second sidewall.

Optionally, the second ceramic carrier comprises second through holes for receiving conducting wires connected between the second metal layer and the second electrode portion.

Optionally, the second ceramic carrier, second metal layer, second sidewall and second support portion are integrally formed.

Optionally, the laser diode device is of the same height as the image sensor.

DETAILED DESCRIPTION OF THE INVENTION

To facilitate understanding of the object, characteristics and effects of this present disclosure, embodiments together with the attached drawings for the detailed description of the present disclosure are provided.

Figure 1:
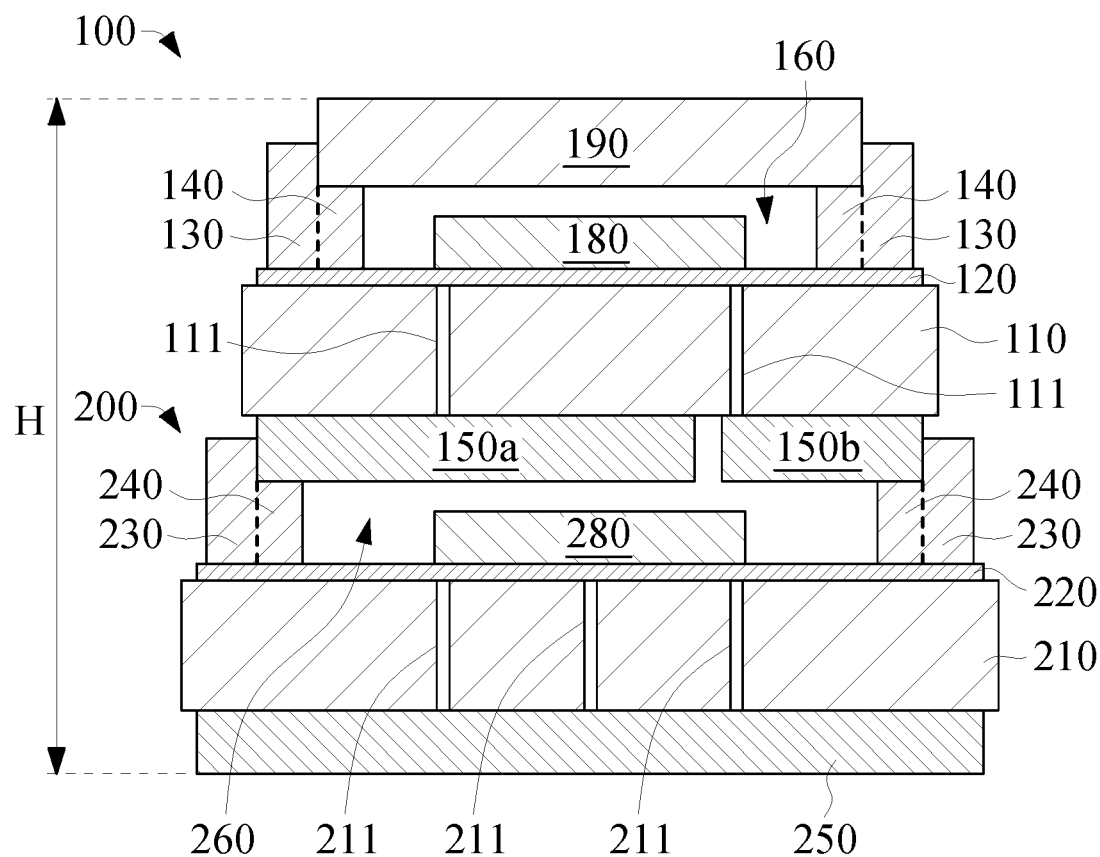
FIG. 1 is a schematic view of a package structure of a laser diode device according to an embodiment of the present disclosure.
Figure 2:
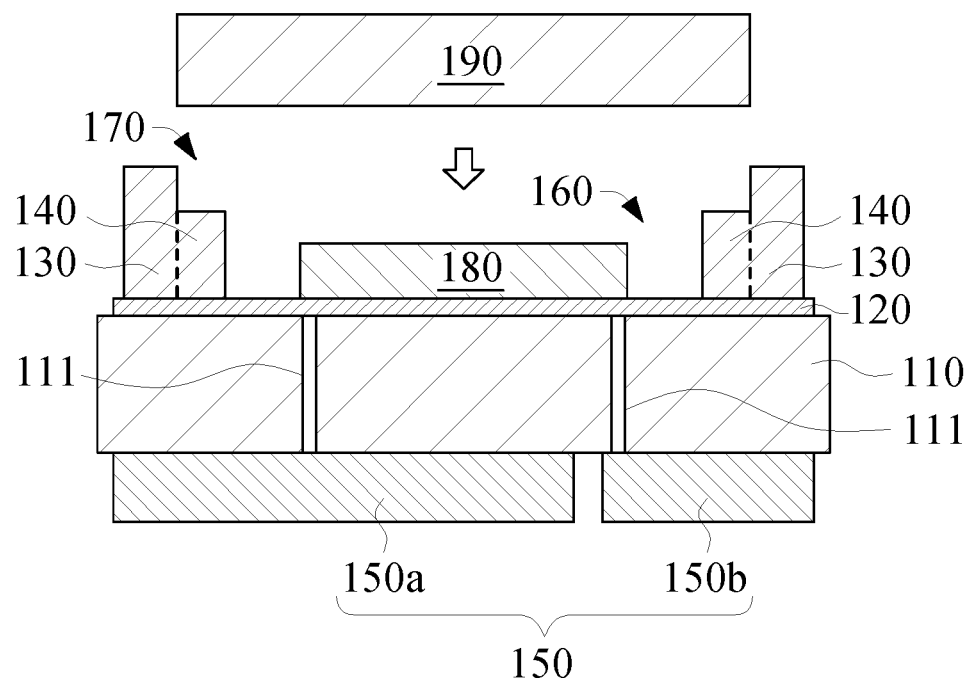
FIG. 2 is a schematic view of a standalone structure of a laser diode module according to an embodiment of the present disclosure.
Figure 3:
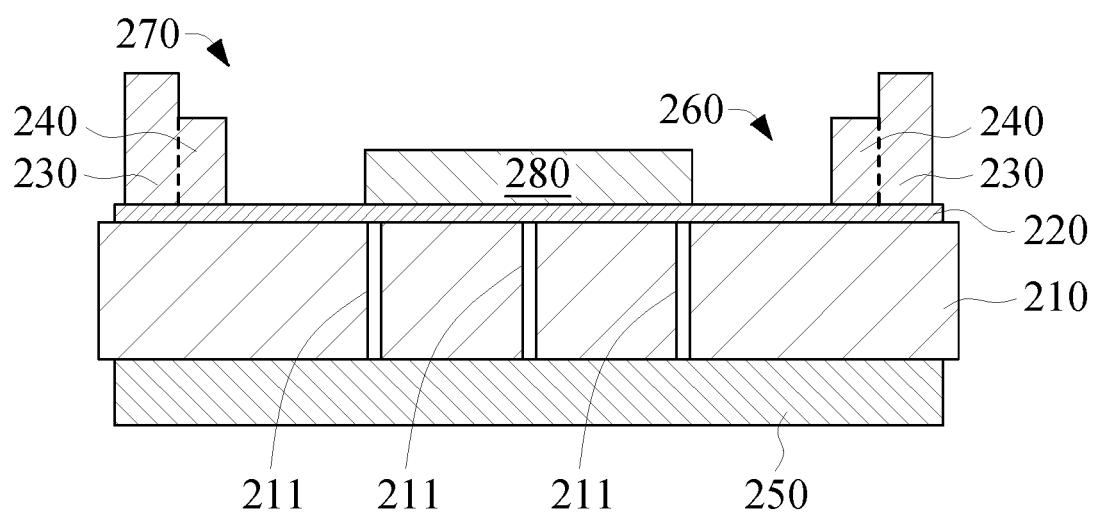
FIG. 3 is a schematic view of a standalone structure of a driving chip module according to an embodiment of the present disclosure.

FIG. 1 is a schematic view of a package structure of a laser diode device 1000 according to an embodiment of the present disclosure. The laser diode device 1000 comprises a laser diode module 100 and a driving chip module 200. FIG. 2 is a schematic view of the standalone structure of the laser diode module 100 according to an embodiment of the present disclosure. FIG. 3 is a schematic view of a standalone structure of the driving chip module 200 according to an embodiment of the present disclosure.

The laser diode module 100 comprises a first carrying element. The first carrying element receives and carries a laser diode component 180 (such as a laser diode chip) and a lens 190. The first carrying element comprises a first ceramic carrier 110, a first metal layer 120, a first sidewall 130, a first support portion 140 and a first electrode portion 150. Disposed on and below the first ceramic carrier 110 are the first metal layer 120 and the first electrode portion 150, respectively. The first electrode portion 150 comprises a first electrode 150a and a second electrode 150b. The first electrode 150a and the second electrode 150b are electrically connected to the positive terminal and negative terminal of the laser diode component 180, respectively. The first sidewall 130 is disposed on the first metal layer 120 and connected to the first metal layer 120. The first sidewall 130 surrounds the first metal layer 120 to form a receiving space. The first support portion 140 is disposed on the inner side of the first sidewall 130 and protrudes from the first sidewall 130 in the direction of the receiving space. The top of the first support portion 140 is lower than the top of the first sidewall 130; hence, the first support portion 140 and the first metal layer 120 define the first receiving space 160 together. The top of the first support portion 140 and the top of the first sidewall 130 together define therebetween a second receiving space 170 above the first receiving space 160. Therefore, the receiving space of the first carrying element includes the first receiving space 160 and the second receiving space 170. The first receiving space 160 receives the laser diode component 180. The second receiving space 170 receives the lens 190. The laser diode component 180 is disposed on the first metal layer 120 and connected to the first metal layer 120. The lens 190 is disposed on and fixed to (for example, by adhesion) the first support portion 140; hence, light rays emitted by the laser diode component 180 are converged with the lens 190 so as to operate in a specific mode and thus reach the outside of the laser diode module 100.

The first ceramic carrier 110 further comprises first through holes 111. The first through holes 111 penetrate the first ceramic carrier 110 from top to bottom to receive conducting wires (such as gold wires) connected between the first metal layer 120 and the first electrode portion 150. Hence, the positive terminal and negative terminal of the laser diode component 180 are electrically connected to the first electrode 150a and the second electrode 150b of the first electrode portion 150, respectively, through the first metal layer 120 and the first through holes 111.

The laser diode component 180 is a vertical-cavity surface-emitting laser (VCSEL) component. The lens 190 is a diffractive optical element (DOE) or a microlens, but the present invention is not limited thereto.

The first metal layer 120 is made of copper, but the present invention is not limited thereto. The first metal layer 120 may be made of any other metal or electrically conductive material as needed.

The first sidewall 130 and the first support portion 140 are made of PPA resin, liquid crystal polymer (LCP) or metal, but the present invention is not limited thereto.

The driving chip module 200 comprises a second carrying element. The second carrying element receives a driving chip 280. The second carrying element comprises a second ceramic carrier 210, a second metal layer 220, a second sidewall 230, a second support portion 240 and a second electrode portion 250. The driving chip 280 generates a driving signal to be provided to the laser diode component 180 such that the laser diode component 180 emits light according to the driving signal. Disposed on and below the second ceramic carrier 210 are a second metal layer 220 and a second electrode portion 250, respectively. The second electrode portion 250 is electrically connected to the driving chip 280 and an external circuit (not shown). The second sidewall 230 is disposed on the second metal layer 220 and connected to the second metal layer 220. The second sidewall 230 surrounds the second metal layer 220 to form a receiving space. The second support portion 240 is disposed on the inner side of the second sidewall 230 and protrudes from the second sidewall 230 in the direction of the receiving space. The top of the second support portion 240 is lower than the top of the second sidewall 230. The second support portion 240 and the second metal layer 220 define a third receiving space 260. The top of the second support portion 240 and the top of the second sidewall 230 define a fourth receiving space 270 disposed above the third receiving space 260. The third receiving space 260 receives the driving chip 280. The fourth receiving space 270 receives and carries the first electrode portion 150 of the laser diode module 100. The driving chip 280 is disposed on the second metal layer 220 and connected to the second metal layer 220. Hence, the first electrode portion 150 is electrically connected to the second sidewall 230 and the second support portion 240. The driving chip 280 is electrically connected to the second sidewall 230 through the second metal layer 220 and transmits the driving signal to the first electrode portion 150 through the second sidewall 230 such that the driving signal is transmitted to the laser diode component 180 through the first electrode portion 150.

The second ceramic carrier 210 further comprises second through holes 211. The second through holes 211 penetrate the second ceramic carrier 210 from top to bottom to receive conducting wires (such as gold wires) connected between the second metal layer 220 and the second electrode portion 250. Hence, the driving chip 280 is electrically connected to the second electrode portion 250 through the second metal layer 220 and the second through holes 211.

The second metal layer 220 is made of copper, but the present disclosure is not limited thereto. The second metal layer 220 may be made of any metal or electrically conductive material as needed.

In an embodiment, the second sidewall 230 and the second support portion 240 are integrally formed with the second metal layer 220 and the second ceramic carrier 210. For instance, the second metal layer 220, second sidewall 230 and second support portion 240 are directly formed on the second ceramic carrier 210 and thus integrally formed. In this embodiment, the second sidewall 230, second support portion 240 and second metal layer 220 are made of copper, but the present disclosure is not limited thereto.

In another embodiment, the second sidewall 230 and the second support portion 240 are made of metal-coated ceramic, PPA resin or liquid crystal polymer (LCP), but the present disclosure is not limited thereto.

Regarding the laser diode device 1000 of the present disclosure, the height of the first sidewall 130 and the second sidewall 230 is chosen according to the height H of the laser diode device 1000 such that the height H of the laser diode device 1000 disposed on a wiring is identical to that of the image sensor; hence, when disposed on a wiring, the laser diode device 1000 need not undergo wire bonding again in order to conform with the height of the image sensor, thereby greatly reducing time and cost spent on manufacturing electronic products. The image sensor are the laser diode device 1000 are mounted on the same electronic device (such as smartphone) for receiving the reflecting laser. The reflecting laser is laser emitted by the laser diode component 180 of the laser diode device 1000, falling on a surface under test (such as a human face), and reflecting off the surface under test such that the electronic device detects distances from different points on the surface under test according to the time of reflection, so as to construct the 3D structure of the surface under test. The image sensor is, for example, a charge coupled device (CCD) lens, but the present disclosure is not limited thereto.

In conclusion, in an embodiment of the present disclosure, the laser diode module 100 and the driving chip module 200 are vertically coupled together and electrically connected to not only reduce the transmission distance which the driving signal travels in order to be transmitted to the laser diode component 180 but also reduce energy loss caused by the transmission path. Therefore, the driving speed of the laser diode component 180 is effectively increased, so as to not only reduce the surface area of the laser diode device 1000 but also render wiring routing convenient. Furthermore, with two carrying elements being adapted to achieve thermal and electrical separation of the laser diode component 180 and the driving chip 280, the performance of the driving chip 280 remains unabated despite the heat generated by the laser diode component 180 in operation.

While the present disclosure has been described by means of specific embodiments, numerous modifications and variations could be made thereto by those skilled in the art without departing from the scope and spirit of the present disclosure set forth in the claims.

What is claimed is:

1. A laser diode device, comprising:
   a laser diode component;
   a lens;
   a first carrying element for receiving the laser diode component and the lens;
   a driving chip; and
   a second carrying element receiving the driving chip, disposed below the first carrying element to carry the first carrying element, and electrically connected to the first carrying element;
   wherein the first carrying element comprises:
      a first ceramic carrier;
      a first metal layer disposed on the first ceramic carrier;
      a first sidewall disposed on the first metal layer;
      a first support portion protruding from an inner side of the first sidewall, wherein the first support portion, the first sidewall and the first metal layer define a first receiving space and a second receiving space together; and
      a first electrode portion disposed below the first ceramic carrier;
   wherein the second carrying element comprises:
      a second ceramic carrier;
      a second metal layer disposed on the second ceramic carrier;
      a second sidewall disposed on the second metal layer;
      a second support portion protruding from an inner side of the second sidewall, wherein the second support portion, the second metal layer and the second sidewall define a third receiving space and a fourth receiving space together; and
      a second electrode portion disposed below the second ceramic carrier.

2. The laser diode device of claim 1, wherein the first receiving space receives the laser diode component, and the second receiving space receives the lens.

3. The laser diode device of claim 1, wherein the first ceramic carrier comprises first through holes for receiving conducting wires connected between the metal layer and the first electrode portion.

4. The laser diode device of claim 1, wherein the first electrode portion comprises a first electrode and a second electrode which are each electrically connected to the laser diode component.

5. The laser diode device of claim 1, wherein the third receiving space receives the driving chip, the fourth receiving space receives the first electrode portion, and the first electrode portion is electrically connected to the second sidewall.

6. The laser diode device of claim 1, wherein the second ceramic carrier comprises second through holes for receiving conducting wires connected between the second metal layer and the second electrode portion.

7. The laser diode device of claim 1, wherein the second ceramic carrier, the second metal layer, the second sidewall and the second support portion are integrally formed.

8. The laser diode device of claim 1, wherein the laser diode device is of a same height as an image sensor.

* * * * *